(12) United States Patent
Joubert et al.

(10) Patent No.: US 6,326,302 B1
(45) Date of Patent: Dec. 4, 2001

(54) PROCESS FOR THE ANISOTROPIC ETCHING OF AN ORGANIC DIELECTRIC POLYMER MATERIAL BY A PLASMA GAS AND APPLICATION IN MICROELECTRONICS

(75) Inventors: Olivier Joubert, Meylan; David Fuard, Villemandeur, both of (FR)

(73) Assignee: France Telecom, Paris (FR)

( * ) Notice: Subject to any disclaimer, the term of this patent is extended or adjusted under 35 U.S.C. 154(b) by 0 days.

(21) Appl. No.: 09/505,448

(22) Filed: Feb. 16, 2000

(30) Foreign Application Priority Data

Feb. 17, 1999 (FR) .................................................. 9901925

(51) Int. Cl.$^7$ ................................................ H01L 21/4763
(52) U.S. Cl. ...................... 438/638; 438/706; 438/719; 156/643; 156/646; 156/659; 156/662; 156/664
(58) Field of Search ................................ 438/638, 706, 438/719; 156/643, 646, 659, 664, 662

(56) References Cited

U.S. PATENT DOCUMENTS

| | | | |
|---|---|---|---|
| 4,529,861 | 7/1985 | Robb | 219/121 |
| 5,057,187 | 10/1991 | Shinagawa et al. | 156/643 |
| 5,074,955 | * 12/1991 | Henry et al. | 156/643 |
| 5,194,118 | 3/1993 | Shinohara | 156/643 |
| 6,010,966 | * 1/2000 | Ionov | 438/706 |

FOREIGN PATENT DOCUMENTS 0 455 031    11/1991   (EP) .

OTHER PUBLICATIONS

Patent Abstracts of Japan, Publication No. 63216346, published Sep. 1988.
Patent Abstracts of Japan, Publicaion No. 04171723, published Jun. 1992.
European Search Report, Application No. 00 40 0363, dated Apr. 10, 2000.

* cited by examiner

*Primary Examiner*—Richard Elms
*Assistant Examiner*—Pho Luu
(74) *Attorney, Agent, or Firm*—Conley, Rose & Tayon, PC; Eric B. Meyertons

(57) ABSTRACT

A process for the anisotropic etching of a dielectric organic polymer material using a plasma is provided. The gas phase of the plasma may include a gas mixture of $O_2/NH_3$, $O_2/H_2O$, $O_2/CH_4$ or $O_2/H_2$. The oxygen concentration of the gas mixture may be less than 40% by volume. The process may include the fabrication of metal interconnects in a damascene-type structure of an integrated circuit.

20 Claims, 3 Drawing Sheets

PROCESS FOR THE ANISOTROPIC ETCHING OF AN ORGANIC DIELECTRIC POLYMER MATERIAL BY A PLASMA GAS AND APPLICATION IN MICROELECTRONICS

BACKGROUND OF THE INVENTION

1. Field of Invention

The present invention relates in a general way to a process for the anisotropic etching of a layer of a dielectric polymer material by means of an oxygen-based plasma.

2. Description of the Related Art

At the present time, interconnects in silicon-based microelectronics are produced using aluminium to form the metal lines and silicon oxide ($SiO_2$) as the insulation dielectric between the metal lines. However, reducing the size of integrated circuits, and therefore increasing the operating speed of the devices, requires the strategy for interconnect formation to be significantly modified, or else the operating speed of the device will be limited by the propagation time of the signals in the interconnects.

To solve this problem, it is therefore necessary to replace the aluminium with a conductive material of lower resistivity, for example copper, and the silicon oxide with a dielectric material having a lower dielectric constant.

There are a wide variety of materials having a dielectric constant lower than $SiO_2$ (which has a dielectric constant of about 4 at the frequencies used for the envisaged applications). One particularly interesting class of materials having a low dielectric constant is that of dielectric polymer materials, in particular purely organic dielectric polymer materials. An example of a suitable polymer material is the material sold by DOW CHEMICAL under the name SILK® which has a dielectric constant of about 2.6.

In order to produce the metal interconnect lines using such dielectric polymer materials as insulation material between the lines, it is necessary firstly to produce, on a layer of the dielectric polymer material, by conventional photolithography, a hard mask, for example of silicon oxide $SiO_2$, which defines the dimensions and shapes of the interconnect lines and holes, and then to etch the pattern of lines and holes in the layer of polymer material. Next, the etched lines and holes are filled with a material, such as copper, and then, as is conventional, the structure obtained is planarized by mechanical-chemical polishing (PMC).

The etching step is an essential operation in the process for fabricating integrated circuits and must be able to obtain etched sidewalls as straight as possible (anisotropic etching).

Furthermore, in order to understand the problems associated with the etching step, it is important to bear in mind that the copper/dielectric polymer material pair is intimately associated with the use of the so-called "damascene" process which makes it possible to define and produce lines and holes simultaneously.

This so-called "damascene" process is shown schematically in FIGS. 1a to 1d.

FIG. 1a shows a conventional "damascene" structure before the interconnect lines and holes have been etched.

As shown in FIG. 1a, this structure includes, within the layer 1 of organic polymer material, stop layers 2 and 3, for example made of oxide $SiO_2$, which are configured and positioned so as to produce interconnect holes and lines.

After a hard mask 4 of suitable pattern has been formed, the interconnect holes 5, 6 and the interconnect line 7 are etched, as shown in FIG. 1b.

The next step is the deposition of metal (for example Cu) in the holes 5, 6 and the line 7 (FIG. 1c) and the planarization of the structure (FIG. 1d). In order to deposit this metal, any conventional method may be used, for example chemical vapour deposition (CVD).

It may be seen from FIG. 1b that the line 7 and the holes 5, 6 must be etched simultaneously, something which complicates the etching operation since the form factors involved are large. Moreover, the etching process must make it possible to achieve significant etching selectivity between the polymer material and the layer 1, for example at the intersection (S) between the line 8 and the hole 7.

The lines and holes are conventionally etched by means of an oxygen plasma which allows both high etch rates and significant and controlled directivity along the normal to the surface of the etched substrate.

The kinetics observed in plasmas are generally attributed, on the one hand, to a phenomenon of dissociation of the reactive gas at the start of the production of reactive atomic species and, on the other hand, to the ionization of the gas, which produces positive ions allowing ion bombardment normal to the surface of the substrate which is at a negative potential with respect to the potential of the plasma.

The actual operation of plasma-etching a layer of polymer material will now be described with reference to FIGS. 2a and 2b.

The action of plasma-etching a layer 1 of polymer material by means of a hard mask 2 may be decomposed into a rate of vertical etching $V_V$ in a direction normal to the layer 1 and a rate of spontaneous lateral etching $V_1$, directed towards the etched sidewalls not subjected to the ion bombardment. As shown in FIG. 2a, the etching of the polymer material 1 has an isotropic etching profile due to the action of the lateral etching $V_1$.

In practice, in order to obtain an anisotropic etching profile, it is necessary to increase the flux of ions bombarding the substrate compared with the flux of reactive species responsible for the spontaneous etching of the etched sidewalls.

The very high reactivity of polymers with the neutral oxygen atoms present in an oxygen plasma makes it very difficult to use pure-oxygen plasmas (when the temperature of the substrate is maintained close to 20° C.). The polymer-etching profiles obtained in an oxygen plasma are not anisotropic, whatever the plasma conditions used. Etching profiles like that shown in FIG. 2a are often observed. To avoid the appearance of lateral etching, it would be desirable to use an etching chemistry, particularly an oxygen-based one, which, combined with the plasma conditions, allows the formation, as in FIG. 2b, of a passivation layer 3 on the sidewalls of the hole or of the line etched in the layer of polymer material 1. This passivation layer 3 must allow the reactions causing spontaneous lateral etching of the polymer to be blocked and therefore anisotropic etching to be obtained.

In plasma etching, a passivation layer is formed from non-volatile or low-volatility compounds which come either from the decomposition of the etching gases or from the reaction products of the etching. These low-volatility products are deposited on the sidewalls of the material from the gas phase of the plasma (when they originate from the decomposition of the etching gas) or come from the sputtering of the reactive layer by the ion bombardment of the plasma. In the latter case, the ion bombardment is conducive to the formation of low-volatility etching reaction products and sputters them onto the sidewalls of the patterns. Whatever the mechanism of formation of the low-volatility products (decomposition of the etching gas or sputtering of the reactive layer), the non-volatile products accumulate only on the unbombarded surfaces of the patterns (the etched sidewalls).

As indicated previously, in a damascene-type process, the step of etching the polymer material is followed by a step of depositing a metal such as copper or possibly aluminium. The metal is therefore in contact with the sidewalls of the polymer and in particular with the passivation layer. It is therefore paramount that the passivation layer be chemically inert with respect to the metal. In particular, corrosion reactions between the metal and the passivation layer must be avoided.

Consequently, it is necessary for the gas phase of the etching plasma to be free of elements capable of generating corrosion reactions with the metal deposited.

Furthermore, the gas phase of the plasma must also not contain elements or compounds capable of impairing the electrical properties of the etched polymer material.

Finally, it is extremely desirable for the etching step to be able to be carried out in complete safety.

DETAILED DESCRIPTION OF THE PREFERRED EMBODIMENTS

Figure 1A:
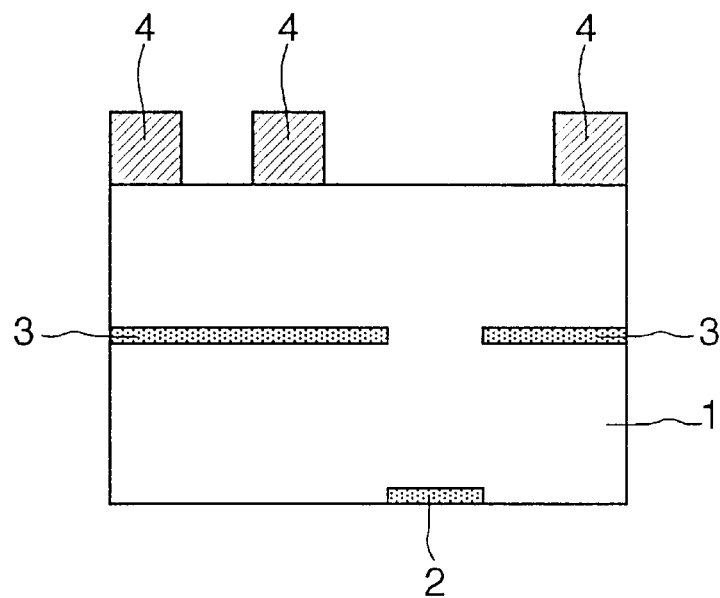
FIGS. 1a–d depict cross-sectional views of a semiconductor substrate processed using a damascene process.
Figure 1B:
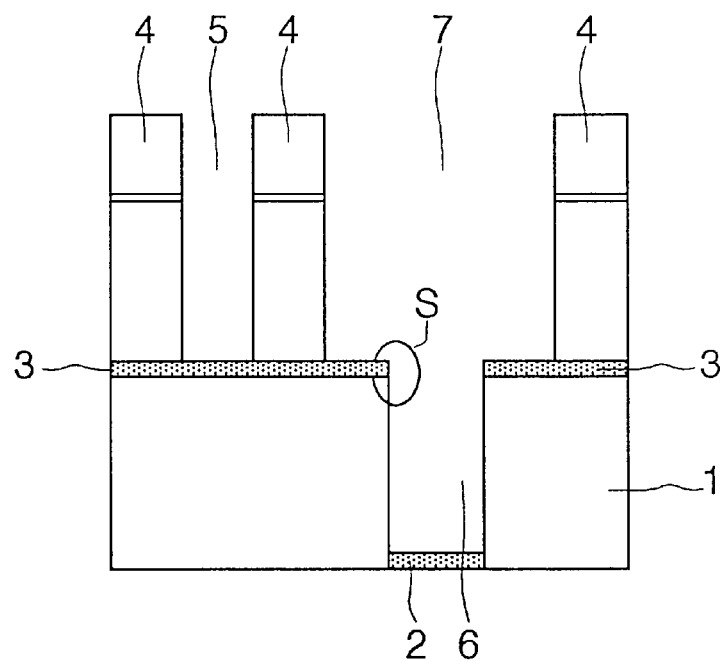
Figure 1C:
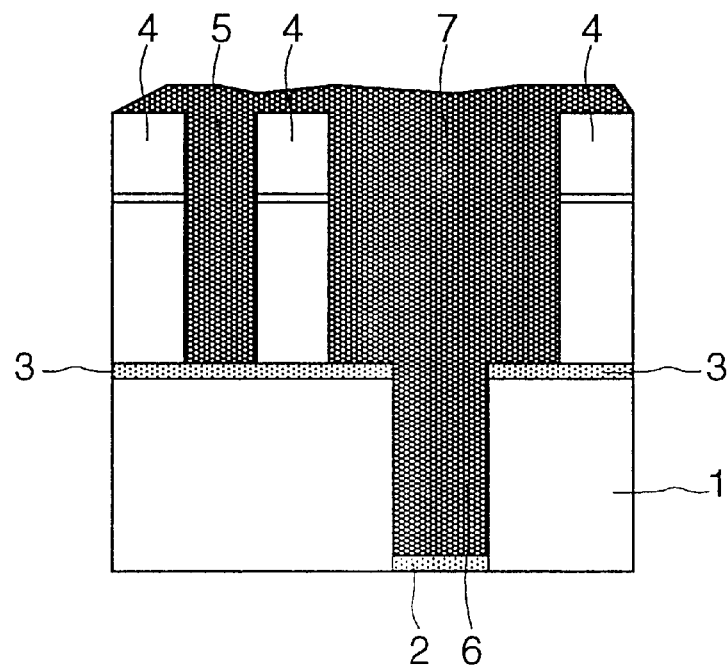
Figure 1D:
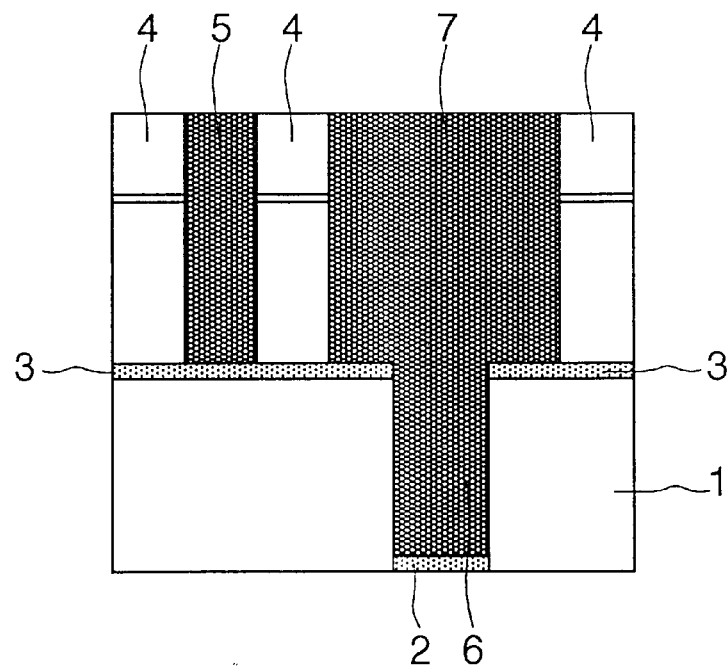
Figure 2A:
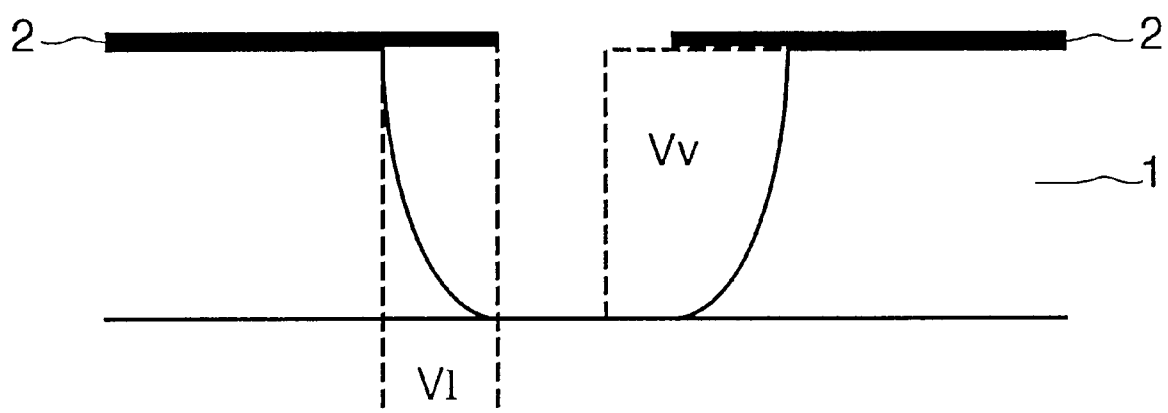
FIGS. 2a–b depict cross-sectional views of a semiconductor substrate after plasma etching of a polymer material layer
Figure 2B:
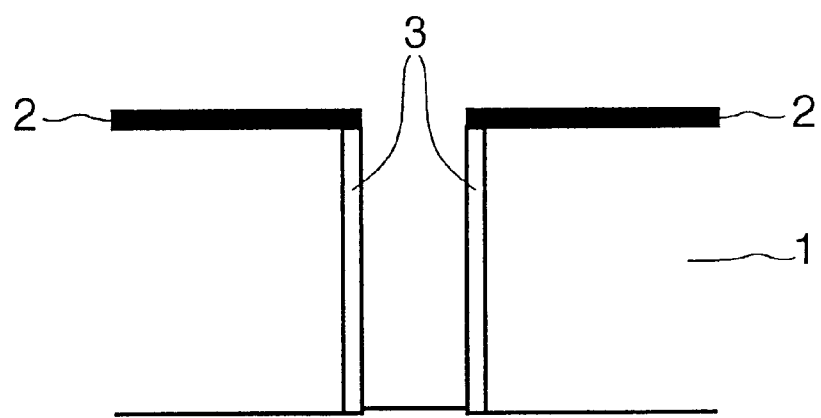

The problems outlined above are in large part solved by a process for the plasma etching, particularly using an oxygen-based plasma, of a layer of polymer material which is anisotropic, non-corrosive and preferably without any danger.

In one embodiment a process for the anisotropic etching of a layer of organic dielectric polymer material includes the anisotropic etching of the polymer layer by means of a plasma whose gas phase consists of $O_2/NH_3$, $O_2/H_2O$, $O_2/CH_4$ or $O_2/H_2$.

In the gas mixtures mentioned, the $O_2$ concentration is generally less than 40% by volume. In particular, for $O_2/NH_3$ and $O_2/H_2O$ mixtures, the $O_2$ concentration is preferably less than 30% by volume for the $O_2/NH_3$ mixture and 15% by volume for the $O_2/H_2O$ mixture. The preferred gas mixtures are $O_2/NH_3$ and $O_2/H_2O$ because of their low danger level. Also preferably, for these mixtures, the $O_2$ volume concentration may vary from 15 to 30% for the $O_2/NH_3$ pair and from 0 to 10% for the $O_2/H_2O$ pair, because of the presence of oxygen in the water molecule.

For all these gas mixtures, a small proportion of nitrogen ($N_2$), for example up to 40% by volume and preferably up to 30% by volume, may optionally be added thereto.

For the plasma etching process, it is possible to use any conventional etching source such as RIE (Reactive Ion Etching) and high-density plasma sources, particularly any etching source of the type used for etching polycrystalline silicon (for example LAM TCP, sold by LAM, or Applied DPS, sold by Applied Materials). The excitation power is generally of the same order of magnitude as for the oxygen-plasma etching of a silicon substrate (400 to 500 W for 200 mm substrates). The substrate is generally maintained at room temperature (20° C.). The total pressure of the gas phase is generally from 13.3 Pa to 5.5 kPa and less than 0.7 kPa in the case of a high-density plasma source. In the case of a high-density plasma source, the bias power applied to the substrate holder is generally greater than that applied in the case of the etching of a silicon gate, and is from 250 to 350 W.

The process may apply to any known dielectric organic polymer material conventionally used for the interconnect insulation in the electronics field and in particular to an organic polymer material having a dielectric constant of less than 4 and preferably about 3 or less.

The process also relates to the application of the anisotropic etching process described above for the fabrication of metal interconnects, particularly made of copper or aluminium, in a damascene-type structure.

This damascene structure comprises stop layers in a substrate made of dielectric organic polymer material and, on the surface of the substrate, a hard mask, the stop layers and the hard mask being configured in order to define the interconnect holes and lines, the damascene structure may be etched using the plasma etching process, described above, and then the interconnect holes and lines are filled with a metal such as copper. This filling may be conventionally carried out by chemical vapour deposition.

Production of the interconnects is then completed by a conventional step of planarization by mechanical-chemical polishing.

EXAMPLE

Interconnect holes were produced using the plasma etching process described above.

The substrate was made of SILK® polymer material, sold by DOW CHEMICAL and had a thickness of 1 μm.

The hard mask was made of a layer of $SiO_2$ with a thickness of 0.15 μm.

The plasma etching was carried out under the following conditions:
Apparatus used: APPLIED DPS
Excitation power: 400 W
Bias power of the substrate: 300 W
Temperature of the substrate: 20° C.
$O_2/NH_3$ gas phase: 20/80 by volume
Pressure: 0.66 Pa.

The etching lasted 1.5 minutes (with a 40% overetching time).

Interconnect holes having a diameter of 0.3 μm and a depth of 1 μm were obtained, the sidewalls of which were perfectly straight.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:
1. Process for the anisotropic etching of a substrate made of a dielectric organic polymer material by means of a plasma, wherein the gas phase of the plasma comprises a gas mixture, wherein the gas mixture comprises $O_2/NH_3$, $O_2/H_2O$, $O_2/CH_4$ or $O_2/H_2$, and wherein the oxygen concentration of the gas mixture is less than 40% by volume.

2. Process according to claim 1, wherein the gas mixture further comprises nitrogen ($N_2$).

3. Process according to claim 2, wherein the nitrogen volume concentration is at most 40%.

4. Process according to claim 2, wherein the nitrogen volume concentration is at most 30%.

5. Process according to claim 1, wherein the gas mixture comprises $O_2/NH_3$, and wherein the $O_2$ volume concentration varies from about 15% to less than about 30%.

6. Process according to claim 1, wherein the gas mixture comprises $O_2/H_2O$, and wherein the $O_2$ volume concentration is equal to or less than 10%.

7. Process according to claim 1, wherein the pressure of the gas phase varies from about 13.3 Pa to about 5.5 kPa.

8. Process according to claim 1, wherein the organic polymer material has a dielectric constant of less than about 4.

9. Process according to claim 1, wherein the organic polymer material has a dielectric constant less than or equal to about 3.

10. Process for the fabrication of metal interconnects in a damascene-type structure, comprising:

forming stop layers in a substrate made of dielectric organic polymer material;

forming a hard mask on one surface of the substrate, the stop layers and the hard mask being configured and placed so as to define interconnect lines and holes etching the substrate by means of a plasma wherein the gas phase of the plasma comprises a gas mixture, and wherein the gas mixture comprises $O_2/NH_3$, $O_2/H_2O$, $O_2/CH_4$ or $O_2/H_2$, and wherein the oxygen concentration of the gas mixture is less than 40% by volume to form interconnect holes and lines in the substrates; and filling of the lines and holes with a conductive material.

11. Process according to claim 10, wherein the conductive material is copper or aluminum.

12. Process according to claim 10 further comprising planarization of the conductive material by mechanical-chemical polishing.

13. Process according to claim 10, wherein the gas mixture further comprises nitrogen ($N_2$).

14. Process according to claim 13, wherein the nitrogen volume concentration is at most 40%.

15. Process according to claim 10, wherein the gas mixture comprises $O_2/NH_3$, and wherein the $O_2$ volume concentration varies from about 15% to less than about 30%.

16. Process according to claim 10, wherein the gas mixture comprises $O_2/H_2O$, and wherein the $O_2$ volume concentration is equal to or less than 10%.

17. Process according to claim 10, wherein the pressure of the gas phase varies from about 13.3 Pa to about 5.5 kPa.

18. Process according to claim 10, wherein the organic polymer material has a dielectric constant of less than about 4.

19. Process according to claim 10, wherein the nitrogen volume concentration is at most 30%.

20. Process according to claim 10, wherein the organic polymer material has a dielectric constant less than or equal to about 3.

* * * * *

UNITED STATES PATENT AND TRADEMARK OFFICE
CERTIFICATE OF CORRECTION

| | |
|---|---|
| PATENT NO. | : 6,326,302 B1 |
| APPLICATION NO. | : 09/505448 |
| DATED | : December 4, 2001 |
| INVENTOR(S) | : Olivier Joubert et al. |

It is certified that error appears in the above-identified patent and that said Letters Patent is hereby corrected as shown below:

Title Page item (56)  References Cited

U.S. PATENT DOCUMENTS delete "4,529,861" and substitute --4,529,860--.

Signed and Sealed this

Thirty-first Day of August, 2010

David J. Kappos
*Director of the United States Patent and Trademark Office*